United States Patent
Doyle et al.

(10) Patent No.: US 10,101,462 B2
(45) Date of Patent: Oct. 16, 2018

(54) MEASURING AND CONTROLLING ELECTROMAGNETIC RADIATION EMITTED BY ELECTRONIC COMPONENTS

(71) Applicant: International Business Machines Corporation, Armonk, NY (US)

(72) Inventors: Matthew S. Doyle, Chatfield, MN (US); Joseph Kuczynski, North Port, FL (US); Kevin A. Splittstoesser, Stewartville, MN (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 541 days.

(21) Appl. No.: 14/883,443

(22) Filed: Oct. 14, 2015

(65) Prior Publication Data
US 2017/0108589 A1    Apr. 20, 2017

(51) Int. Cl.
G01S 19/37    (2010.01)

(52) U.S. Cl.
CPC .................. *G01S 19/37* (2013.01)

(58) Field of Classification Search
CPC ...................................... G01S 19/37
See application file for complete search history.

(56) References Cited

U.S. PATENT DOCUMENTS

| 6,483,304 | B1* | 11/2002 | Kou ................... G01R 29/0878 324/225 |
| 6,924,977 | B2 | 8/2005 | Bestwick et al. |
| 7,613,576 | B2 | 11/2009 | Gross et al. |
| 7,952,447 | B2 | 5/2011 | Dyer et al. |
| 8,294,382 | B2 | 10/2012 | DeVincentis et al. |
| 8,868,361 | B2 | 10/2014 | McCullough et al. |
| 2006/0132118 | A1* | 6/2006 | Maekawa .......... G01R 29/0814 324/96 |
| 2013/0242621 | A1 | 9/2013 | Hussain et al. |
| 2014/0367556 | A1 | 12/2014 | Lichtenegger et al. |

* cited by examiner

*Primary Examiner* — Clayton E LaBalle
*Assistant Examiner* — Jas Sanghera
(74) *Attorney, Agent, or Firm* — Patterson + Sheridan, LLP

(57) ABSTRACT

An apparatus and system for measuring electromagnetic radiation emitted by one or more electronic components included on a first substrate, and an associated method of controlling the emitted radiation. The apparatus includes a cap member having an interior surface and an exterior surface, the interior surface defining an interior cavity and arranged to receive at least a portion of the one or more electronic components within the interior cavity. The apparatus further includes at least one sensor device coupled with the cap member and configured to detect electromagnetic radiation emitted by the one or more electronic components. The apparatus further includes at least one conductive pad disposed on the cap member and coupled with the at least one sensor device, wherein the conductive pad is configured to couple with external circuitry to transmit a sensor signal generated by the at least one sensor device responsive to the detected electromagnetic radiation.

20 Claims, 4 Drawing Sheets

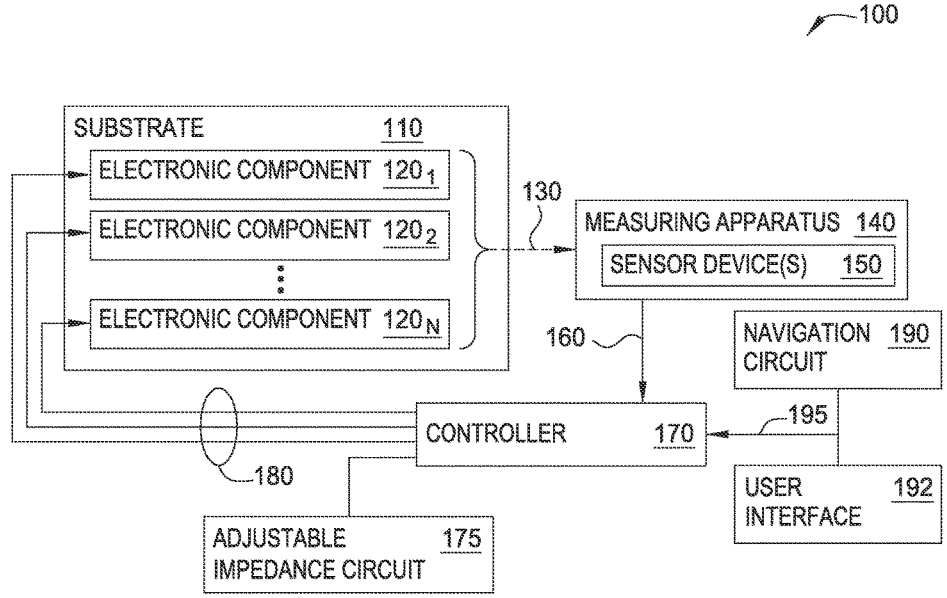
FIG. 1
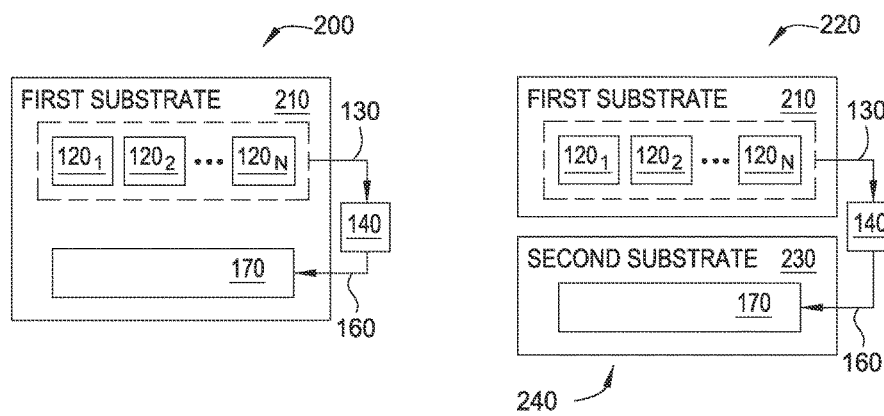
FIG. 2A
FIG. 2B

MEASURING AND CONTROLLING ELECTROMAGNETIC RADIATION EMITTED BY ELECTRONIC COMPONENTS

BACKGROUND

The present disclosure relates to techniques for measurement and adaptive control of electromagnetic (EM) radiation emitted by electronic circuits.

Before introduction to the commercial market, electronic devices are typically tested for EM compatibility (EMC) to confirm that the devices meet prescribed EMC standards. However, the process of identifying and correcting EMC violations during development of the electronic devices poses a labor-intensive and often highly technical challenge, requiring isolating the source(s) of the violating EM radiation and possibly reconfiguring the circuitry of the devices. Additionally, the testing of electronic devices typically requires the use of specialized chambers and personnel, adding significantly to development costs for the devices.

SUMMARY

According to one embodiment, an apparatus is disclosed for measuring electromagnetic radiation emitted by one or more electronic components included on a first substrate. The apparatus includes a cap member having an interior surface and an exterior surface, the interior surface defining an interior cavity and arranged to receive at least a portion of the one or more electronic components within the interior cavity. The apparatus further includes at least one sensor device coupled with the cap member and configured to detect electromagnetic radiation emitted by the one or more electronic components. The apparatus further includes at least one conductive pad disposed on the cap member and coupled with the at least one sensor device, wherein the conductive pad is configured to couple with external circuitry to transmit a sensor signal generated by the at least one sensor device responsive to the detected electromagnetic radiation.

According to another embodiment, a system is disclosed that includes a first substrate comprising one or more electronic components and at least one measuring apparatus. Each measuring apparatus comprises a cap member having an interior surface and an exterior surface, the interior surface defining an interior cavity and arranged to receive at least a portion of the one or more electronic components within the interior cavity, and at least one sensor device coupled with the cap member and configured to generate a sensor signal response to detecting electromagnetic radiation emitted by the one or more electronic components. The measuring apparatus further comprises at least one conductive pad disposed on the cap member and coupled with the at least one sensor device. The system further includes a controller coupled with the at least one measuring apparatus through the at least one conductive pad and with the one or more electronic components, the controller configured to transmit control signals to alter operation of the one or more electronic components based on the sensor signal received from the at least one sensor device.

According to another embodiment, a method is disclosed of controlling electromagnetic radiation emitted by one or more electronic components disposed on a first substrate and at least partially included within an interior cavity formed by an interior surface of a cap member. The method includes generating, using a sensor device coupled with the cap member, a sensor signal responsive to detecting electromagnetic radiation emitted by the one or more electronic components. The method further includes receiving, via a conductive pad disposed on the cap member and coupled with the sensor device, the generated sensor signal at a controller coupled with the conductive pad and coupled with at least one of the one or more electronic components. The method further includes transmitting, based on the received signal, control signals from the controller to the at least one electronic component to alter operation of the at least one electronic component, thereby altering an amount of electromagnetic radiation emitted by the at least one electronic component.

BRIEF DESCRIPTION OF THE SEVERAL VIEWS OF THE DRAWINGS

FIG. 1 illustrates a system for controlling electromagnetic radiation emitted by one or more electronic components disposed on a substrate, according to one embodiment.

FIGS. 2A and 2B each illustrate an exemplary arrangement of electronic components with an associated controller, according to one embodiment.

Figure 3:
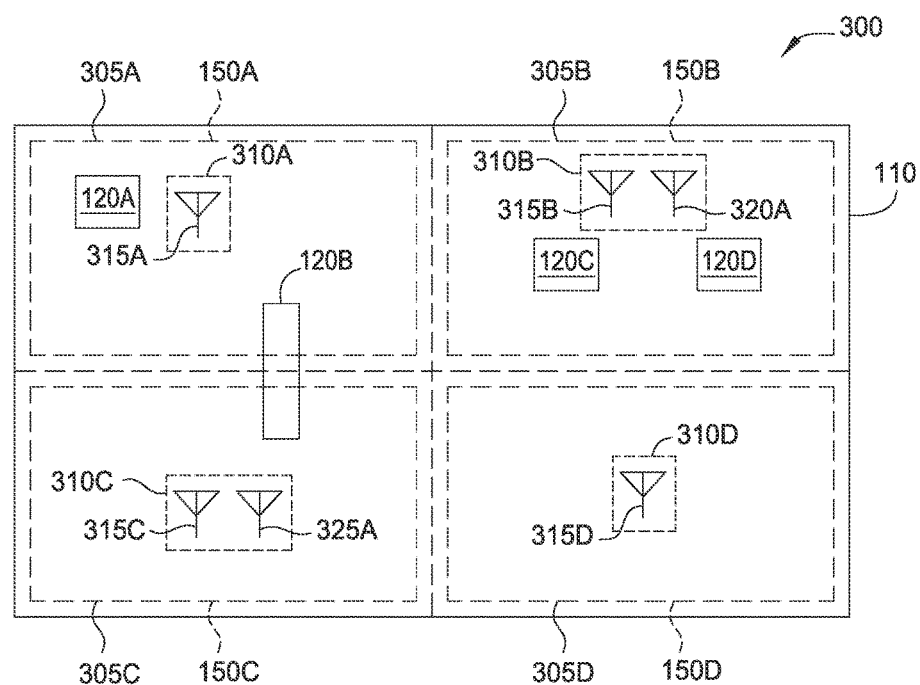
FIG. 3 illustrates an exemplary arrangement of sensor devices corresponding to regions of a substrate, according to one embodiment.

To facilitate understanding, identical reference numerals have been used, where possible, to designate identical elements that are common to the figures. It is contemplated that elements disclosed in one embodiment may be beneficially utilized on other embodiments without specific recitation. The illustrations referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments, and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system."

Embodiments are generally directed to techniques for measuring and controlling the EM radiation generated by electronic components on a substrate. The measuring apparatus described herein can reduce or eliminate the need for specialized EMC testing of the substrate, saving significant monetary costs and getting devices to market faster. The measuring apparatus may further be used during operation of the device to allow a controller to adaptively control performance of the electronic components while maintaining compliance with EM guidelines. In some cases, the controller may determine the location of the substrate or electronic components and alter the operation of the electronic components based on EM guidelines specific to the location. The measuring apparatus may be produced as an off-the-shelf design corresponding to standardized footprints.

FIG. 1 illustrates a system for controlling electromagnetic radiation emitted by one or more electronic components disposed on a substrate, according to one embodiment. System 100 includes at least a substrate 110, a measuring apparatus 140, and a controller 170.

Substrate 110 generally represents any rigid or flexible body that is configured to physically couple with one or more electronic components $120_{1-N}$ (generically or collectively, "electronic components 120") and to provide interconnections therewith and/or therebetween. Substrate 110 may have any suitable form, such as a printed circuit board that includes conductive traces in one or multiple layers of the board, the conductive traces connecting electronic components 120 that are disposed on the substrate 110. For purposes of this disclosure, "disposed on" is intended to encompass various physical relationships between the electronic components 120 and the substrate 110 that are known in the art, such as removably attaching (e.g., using a socket included with substrate 110) or fixedly attaching (e.g., soldering to substrate 110) the electronic components 120 with a surface(s) of the substrate 110, at least partially embedding the electronic components 120 within the substrate 110, or combinations thereof.

For simplicity, the substrate 110 is depicted in subsequent figures as being generally planar (e.g., having a thickness or depth that is negligible relative to the other dimensions), but may have any suitable form and spatial dimensions. For example, the substrate 110 may include one or more curved edges or surfaces, or may substantially extend in three dimensions (i.e., having a non-negligible thickness), etc. The electronic components $120_{1-N}$ may be any components that generate EM radiation during operation. Electronic components $120_{1-N}$ may include discrete integrated circuits (ICs) or other logic circuitry having any suitable function, such as controllers, processors, memories, logic gates, and the like.

System 100 includes one or more measuring apparatus 140 that are operable to detect EM radiation 130 emitted from electronic components 120 during their respective operation. The measuring apparatus 140 may be made of any suitable materials, e.g., glass, layered plastics such as polyvinyl chloride (PVC), polychlorotrifluoroethylene (PCTFE), cyclic olefin copolymers (COC), cyclic olefin polymers (COP), polypropylene (PP), polyethylene (PE), glycol-modified polyethylene (PETg), and so forth. The measuring apparatus 140 may be formed according to known techniques, such as thermoforming a sheet of plastic into suitable shapes. For example, elements of one or multiple measuring apparatus 140 may be manufactured or formed using techniques for producing blister packaging. In some cases, multiple measuring apparatus 140 can be formed contemporaneously within a singular element, and later divided into individual measuring apparatus 140.

Each measuring apparatus 140 may be configured and spatially disposed to receive EM radiation emitted by one or more specific electronic components 120 disposed on the substrate 110. For example, a measuring apparatus 140 corresponding to a first electronic component 120 may be disposed much more closely to the first electronic component 120 than to a second electronic component 120 for which the measuring apparatus 140 is not intended to measure emitted EM radiation. In one embodiment, each measuring apparatus 140 corresponds to a particular electronic component 120 in a one to one ratio. In other embodiments, at least one of the measuring apparatus 140 corresponds to a plurality of electronic components 120. In some embodiments, the measuring apparatus 140 is dimensioned to define an internal cavity into which the corresponding one or more electronic components 120 are received. The measuring apparatus 140 may be fixedly or removably attached to the substrate 110, such that the measuring apparatus 140 when seated against the substrate 110 at least partly includes the electronic components 120 within the internal cavity. For example, the measuring apparatus 140 may be attached to an underlying substrate using an adhesive having conductive properties.

Each measuring apparatus 140 includes one or more sensor devices 150. Sensor devices 150 may include any suitable passive or active circuitry that is configured to detect EM radiation 130 and to generate a sensor signal 160 in response thereto. For example, sensor devices 150 may include (passive) antenna devices, in which an electrical signal is induced responsive to detecting EM radiation in a range corresponding to the characteristics of the antenna. In some embodiments, tuning of the sensor devices 150 may be controlled (e.g., by controller 170) to correspond to desired measuring frequencies or frequency ranges. In some embodiments, more than one sensor device 150 is included with a particular measuring apparatus 140. For example, a measuring apparatus 140 may include multiple antenna devices having different configurations such that emitted EM radiation can be contemporaneously sensed for different frequency ranges. As EMC testing standards will often correspond to the performance of the electronic components 120 with respect to discrete frequencies (or within discrete frequency ranges), the properties of sensor devices 150 may be selected and/or controlled according to the applicable testing standards.

The controller 170 is generally configured to receive the generated sensor signal(s) 160 from the one or more measuring apparatus 140, and to produce control signals 180 to alter the operation of the electronic components 120. The controller 170 may have any suitable form, such as a general purpose microprocessor, microcontroller, application-specific integrated circuit (ASIC), or other suitable logic circuitry. The controller 170 may include hardware, firmware, and/or software for performing the functions described herein.

Altering the operation of electronic components 120 generally causes the electronic components 120 to emit different amounts of EM radiation 130, which may be manifested as increased or decreased EM radiation at the same frequencies, or at different frequencies. One example of altering the operation of electronic components 120 may include invoking a spread-spectrum mode in which the energy included in interference peaks (which may be sufficiently large and violate EMC guidelines or requirements) is redistributed across a spectrum of frequencies. In some cases, however, certain electronic components 120 may not natively include a spread-spectrum capability, or the decreased performance due to employing spread-spectrum techniques may be unacceptable.

Altering the operation of electronic components 120 may occur within the context of testing the electronic components 120, for example, measuring the amounts of EM radiation that are emitted when the electronic components 120 operate with different operational states, modes, parameters, etc. The measured EM radiation information may then be used by the controller 170 during operation of the electronic components 120 to ensure compliance with EMC guidelines. Altering the operation of electronic components 120 may additionally or alternatively occur during the operation of the electronic components 120 within a produced electronic device (e.g., following testing and finalized design phases of production). For example, the controller 170 may alter the operation of one or more of the electronic components 120 to limit the corresponding emitted EM radiation to remain within prescribed EMC guidelines. In another example, the controller 170 alters the operation of certain electronic components 120 to increase their performance—despite a corresponding increase in emitted EM radiation—while remaining within prescribed guidelines.

In some embodiments, the system 100 includes at least one of a navigation circuit 190 and a user interface 192 that provide location information 195 to the controller 170. In some cases, the navigation circuit 190 may be included in the controller 170. In one embodiment, the navigation circuit 190 represents a Global Positioning System (GPS) circuit or other satellite-based positioning circuitry. The navigation circuit 190 may provide location information 195 using any other suitable means, e.g., an included hardware-based inertial measurement unit, antennas configured to receive radio frequency (RF) signals such as terrestrial radio, television signals, cell phone signals, as well as combinations thereof. The user interface 192 may include any suitable device for receiving input from an associated user, such as a keyboard, mouse, touchscreen, buttons, etc. The user interface 192 may be associated with a produced electronic device that includes the substrate 110, such as a touchscreen included as part of the electronic device.

The controller 170 receives location information 195 from at least one of navigation circuit 190 and user interface 192 to determine a current location of the substrate 110 or of electronic components 120 included thereon. In some embodiments, the location information 195 is used by the controller 170 to produce the control signals 180. For example, if the controller 170 determines that the substrate 110 has been moved to a location having more stringent EMC requirements (e.g., a different country), the controller 170 may adapt the control signals 180 to reduce the EM radiation emitted by one or more of the electronic components 120.

In some embodiments, the system 100 also includes an adjustable impedance circuit 175 which is controlled by the controller 170. The adjustable impedance circuit 175 may include one or more discrete circuit components, such as a variable resistor and/or capacitor, or may include any other device having an adjustable conductance (such as a transistor). The adjustable impedance circuit 175 may be electrically coupled with one or more portions of electronic components 120. During operation of the electronic components 120, the adjustable impedance circuit 175 may be tuned or otherwise adjusted to alter the EM radiation of the electronic components 120.

FIGS. 2A and 2B each illustrate an exemplary arrangement of electronic components with an associated controller, according to one embodiment. In arrangement 200, a first substrate 210 includes the one or more electronic components 120$_{1-N}$ as well as the controller 170. The measuring apparatus 140 receives the EM radiation 130 that is emitted from the one or more electronic components 120 and generates sensor signal(s) 160 which are provided to the controller 170. Although not shown here, the controller 170 generates control signals for one or more of the electronic components 120 based on the received sensor signals 160.

In arrangement 220, the one or more electronic components 120$_{1-N}$ are included on the first substrate 210 while the controller 170 is included on a second substrate 230. In some embodiments, the second substrate 230 is included in a separate testing device 240 configured to removably couple with the first substrate 210.

FIG. 3 illustrates an exemplary arrangement of sensor devices corresponding to regions of a substrate, according to one embodiment. In arrangement 300, the substrate 110 is depicted as generally planar but may have any suitable alternative form and dimensions. Substrate 110 includes a number of electronic components 120A-D disposed thereon. The surface of substrate 110 is divided into a plurality of regions 305A-305D (generically or collectively, regions 305). Each region 305 corresponds to a respective one or more sensor devices 150A-150D that are configured to sense EM radiation emitted by the electronic components 120 included within the particular region 305. Each of sensor devices 150A-150D may represent one or a plurality of sensor devices 150. In one embodiment, each region 305 corresponds to a different measuring apparatus (i.e., sensor device(s) 150A are included with a first measuring apparatus, sensor device(s) 150B with a second measuring apparatus, etc.). In another embodiment, more than one region 305 corresponds to a particular measuring apparatus, and the sensor devices 150 are arranged within the measuring apparatus to sense EM radiation from the respective regions 305.

While each of the regions 305 is shown as rectangular and approximately equal in size, the relative shapes and sizes of regions 305 may vary.

In arrangement 300, the sensor devices 150A corresponding to region 305A include antenna device 315A. Antenna device 315A is configured to detect EM radiation in a first frequency range, and is shown within a dashed box 310A to denote that the antenna device 315A is not disposed on the substrate 110 (unlike the electronic components 120). The antenna device 315A may have any suitable arrangement, such as a ring antenna formed of conductive material deposited onto a surface of a measuring apparatus. As discussed above, sensor devices 150 may include different passive or active types of sensor devices beyond antenna devices. The sensor devices 150B corresponding to region 305B include antenna device 315B (sensing in the first frequency range) and antenna device 320A, which senses in a second frequency range. The sensor devices 150C corresponding to region 305C include antenna device 315C (sensing in the first frequency range) and antenna device 325A (which senses in a third frequency range). The sensor devices 150D corresponding to region 305D include antenna device 315D, which senses in the first frequency range. The first, second, and third frequency ranges may all differ, and are provided as one possible arrangement.

Dividing the substrate 110 into one or more regions helps to localize the source(s) of particular EM radiation during testing and/or operation of the electronic components 120, allowing for a more tailored control of the electronic components 120 to control their performance while still meeting EMC guidelines. For example, electronic component 120B is partially disposed in regions 305A and 305C. Assume that the antenna device 315A measures a substantial amount of EM radiation corresponding to the first frequency range. If antenna device 315C (also corresponding to the first frequency range) contemporaneously measures a substantial amount of EM radiation, the source of the radiation in region 305A is likely to be identified as the electronic component 120B and not the electronic component 120A. Accordingly, the controller may first alter the operation of electronic component 120B in an attempt to reduce the emitted EM radiation. If altering operation of electronic component 120B does not reduce the radiation detected by the antenna devices 315A and 315C, the controller may next alter the operation of electronic component 120A.

In some embodiments, one or more of the sensor devices 150 may be provided to measure a baseline radiation. For example, region 305D does not include any electronic components that are suspected of emitting significant amounts of EM radiation. The corresponding antenna device 315D may thus measure a background EM radiation level for the first frequency range, whether the radiation is caused by other components disposed in region 305D of the substrate 110 and/or caused by neighboring substrates or other components outside of the substrate 110. The measured background EM radiation level in the first frequency range may be used by the controller to adjust or correct other measured radiation levels occurring within the same frequency range (e.g., by antenna devices 310A, 310B, and 310C).

Figure 4:
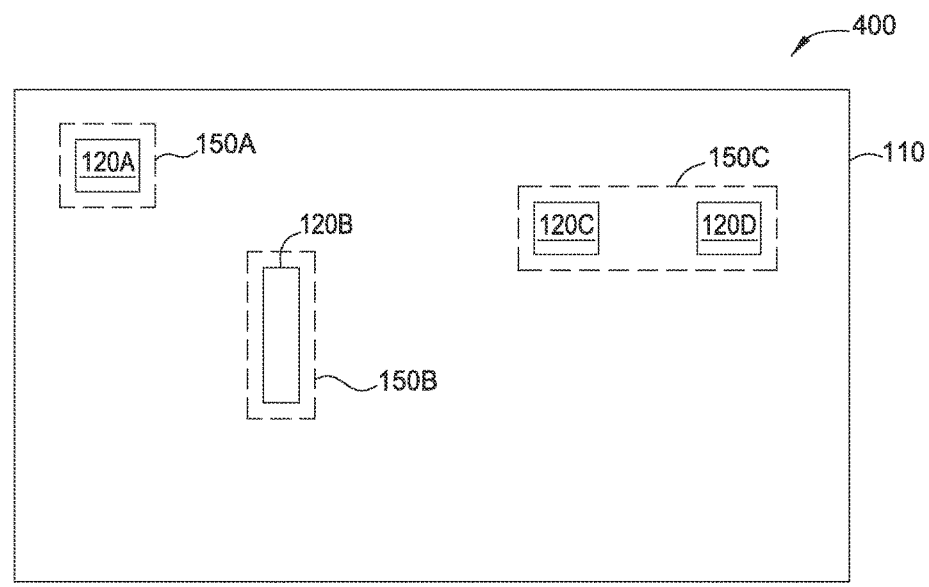
FIG. 4 illustrates an exemplary arrangement of sensor devices corresponding to particular electronic components disposed on a substrate, according to one embodiment.

FIG. 4 illustrates an exemplary arrangement of sensor devices corresponding to particular electronic components disposed on a substrate, according to one embodiment. In arrangement 400, the substrate 110 includes a number of electronic components 120A-120D. A respective one or more sensor devices 150A-150C are provided to individual electronic components 120, or to specific groupings of electronic components 120. As shown, sensor device(s) 150A correspond to electronic component 120A, sensor device(s) 150B to electronic component 120B, and sensor device(s) 150C to electronic components 120C and 120D. In some embodiments, each of sensor devices 150A-150C are included in a different measuring apparatus (i.e., sensor device(s) 150A corresponding to a first measuring apparatus, sensor device(s) 150B to a second measuring apparatus, etc.). The sizing of each measuring apparatus may correspond to the specific size and/or shape of the electronic components 120. Especially for cases in which the electronic components 120 use a standardized footprint (e.g., packaging for ICs), the measuring apparatus may be provided as an off-the-shelf solution for measuring EM radiation for circuitry. Sizing the measuring apparatus to more closely correspond to the electronic components 120 may also help to provide more accurate measurement of EM radiation.

FIG. 3 depicts one arrangement of sensor devices corresponding to substrate regions and FIG. 4 depicts one arrangement of sensor devices corresponding to the specific disposition of electronic components. However, alternate embodiments may use a combination of features from both types of arrangements, such that first sensor devices correspond to certain regions of the substrate and second sensor devices correspond more specifically to certain electronic components disposed on the substrate. Furthermore, the sensor coverage for regions and for electronic components may overlap in some cases, and may be distinct (non-overlapping) in other cases.

Figure 5:
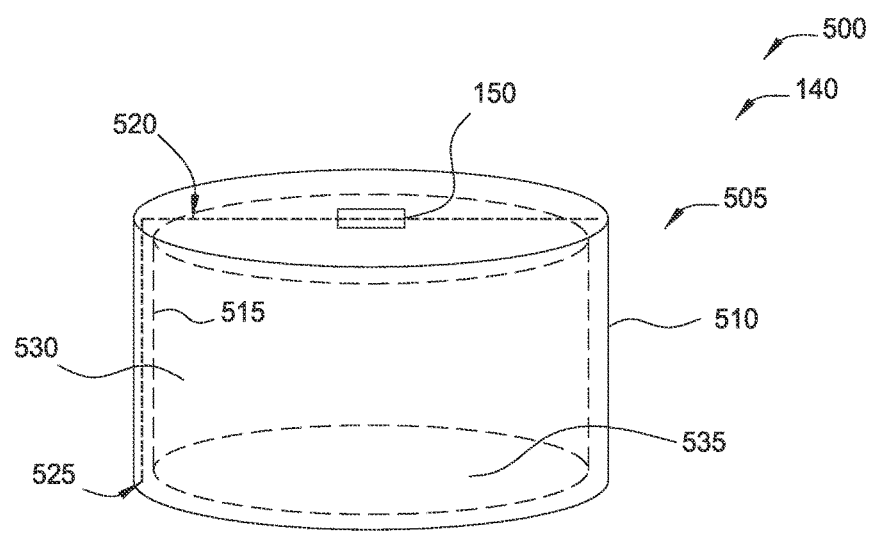
FIG. 5 illustrates an apparatus for measuring electromagnetic radiation emitted by one or more electronic components disposed on a substrate, according to one embodiment.

FIG. 5 illustrates an apparatus for measuring electromagnetic radiation emitted by one or more electronic components disposed on a substrate, according to one embodiment. The configuration 500 is meant to illustrate one possible configuration of a measuring apparatus 140; other configurations consistent with the discussion herein are possible.

In configuration 500, the measuring apparatus 140 includes a cap member 505 having an outer surface 510 and an inner surface 515. As discussed above, the measuring apparatus 140 may be constructed using any suitable materials (e.g., plastics, glass, etc.) and having any suitable dimensions (e.g., shape, wall thickness, height, size of openings, etc.). In some embodiments, the materials selected for the measuring apparatus 505 have a relatively low magnetic permeability and do not provide substantial EM shielding of the electronic components. As shown, the cap member 505 includes a top surface 520 and one or more side walls 525. For clarity, cap member 505 is depicted as having a generally cylindrical shape, but may alternately have any other suitable shape (which may include conformal shaping of the cap member 505, such as by forming blisters using blister package manufacturing techniques). In some embodiments, the outer surface 510 and inner surface 515 are curved and may not have a defined top surface or side wall.

The inner surface 515 of the cap member 505 defines an inner cavity 530, which may be hollow (e.g., including air or other gas). The inner surface 515 also defines at least one opening 535, through which one or more electronic components is received into the inner cavity 530. Although not shown, the cap member 505 may include one or more additional openings formed through the inner surface 515 and outer surface 510 for different reasons, such as ventilation for the electronic components, a conduit for electrical connections such as wires, etc.

The cap member 505 includes one or more sensor devices 150 configured to detect EM radiation emitted by electronic components. Although shown as disposed along the top surface 520 of the cap member 505, sensor devices 150 may additionally or alternately be disposed at any suitable location along the outer surface 510 and/or inner surface 515, and/or embedded in the cap member 505.

Figure 6:
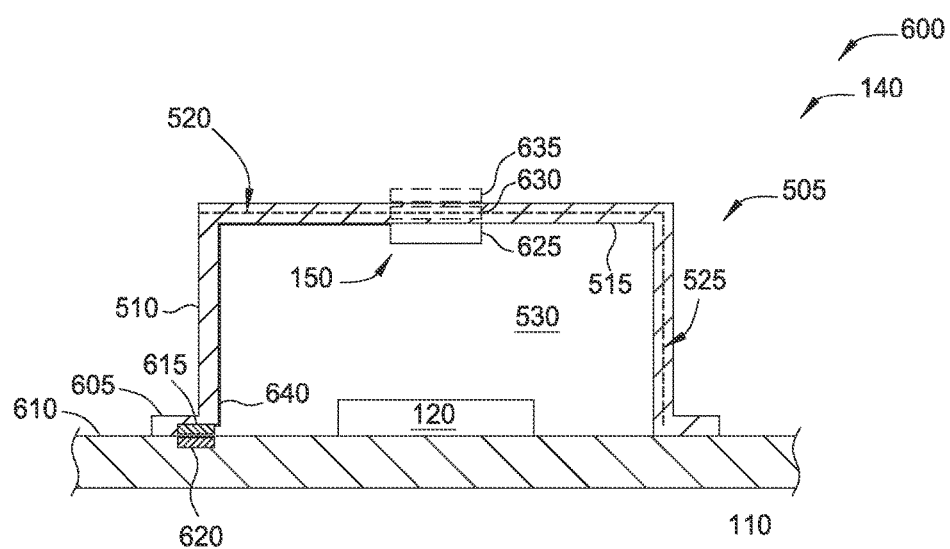
FIG. 6 is a cross-section diagram of an exemplary apparatus for measuring electromagnetic radiation emitted by one or more electronic components disposed on a substrate, according to one embodiment.

FIG. 6 is a cross-section diagram of an exemplary apparatus for measuring electromagnetic radiation emitted by one or more electronic components disposed on a substrate, according to one embodiment. Generally, the configuration 600 corresponds to a measuring apparatus 140. The cap member 505 includes outer surface 510 and inner surface 515, which form a top wall 520 and side wall(s) 525. The material of the cap member 505 may also be formed as foot portion(s) 605 that extend laterally from the side wall 525. The cap member 505 is configured to be at least partially seated against a surface 610 of a substrate 110, e.g., at the foot portion(s) 605. When the cap member 505 is seated against the substrate 110, one or more electronic components 120 are at least partly disposed in the interior cavity 530. The foot portion 605 includes a conductive pad 615 that, when the cap member 505 is seated against the substrate 110, aligns with a corresponding conductive pad 620 included in the substrate 110. In some embodiments, the cap member 505 is attached to the substrate 110 using a conductive adhesive material that supports the conductive connection of conductive pads 615, 620. The conductive pad 620 may have any suitable form, such as a "landing pad" disposed at the surface of substrate 110 and near the electronic component 120. Conductive pad 615 is configured to couple with sensor device 150 using a conductive trace 640 or similar conductive element that is disposed on or embedded in the cap member 505. Additionally, the conductive pad 620 included in the substrate 110 is communicatively coupled with the controller through one or more conductive paths, such that the controller receives the sensor signals produced by the sensor devices 150 responsive to detecting EM radiation. Although only a single sensor device 150 is depicted, cap member 505 may alternatively include a plurality of sensor devices 150 that are each coupled with a respective conductive pad 615 through respective conductive elements. In some embodiments, the sensor device 150 receives control signals via a first conductive pad 615 and a first conductive trace 640, and transmits the sensor signal via a second conductive trace 640 and second conductive pad 615. The control signals for the sensor device 150 may include, e.g., a power signal, biasing signal, digital control signals, etc. In some cases, the controller used to receive the sensor signal is further configured to transmit the control signals for the sensor device 150.

FIG. 6 depicts a relatively simple geometry of the cap member 505, where the foot portion(s) 605 are disposed in a planar arrangement, such as in a rim formed around the interior cavity 530. However, more complex geometric structures are also possible, such as foot portions 605 having different orientations and/or disposed at different distances from a planar surface of substrate 110. For example, one foot portion 605 may be seated against the planar surface, and another may be seated against a portion (e.g., laterally, atop, etc.) of the substrate projecting from the planar surface. In each of these cases, the conductive pads 615 can be included in the foot portion(s) 605 and can have different orientations. In other embodiments, the cap member 505 does not include a distinct foot portion 605. For example, the side wall 525 of the cap member 505 may have a sufficient thickness such that the conductive pad 615 may be formed within or on the side wall 525 and coupled with a conductive pad 620.

The cap member 505 includes one or more sensor devices 150. The sensor devices 150 may be disposed at any suitable location on or within the cap member 505, such as a position 625 along the inner surface 515, a position 630 embedded within the cap member 505, and/or a position 635 along the outer surface 510. The sensor devices 150 may be emplaced or deposited onto the cap member using any known techniques. Sensor signals produced by the one or more sensor devices 150 and indicating detected EM radiation are carried along conductive traces and through conductive pads 615 and 620, and ultimately to a communicatively coupled controller.

Figure 7:
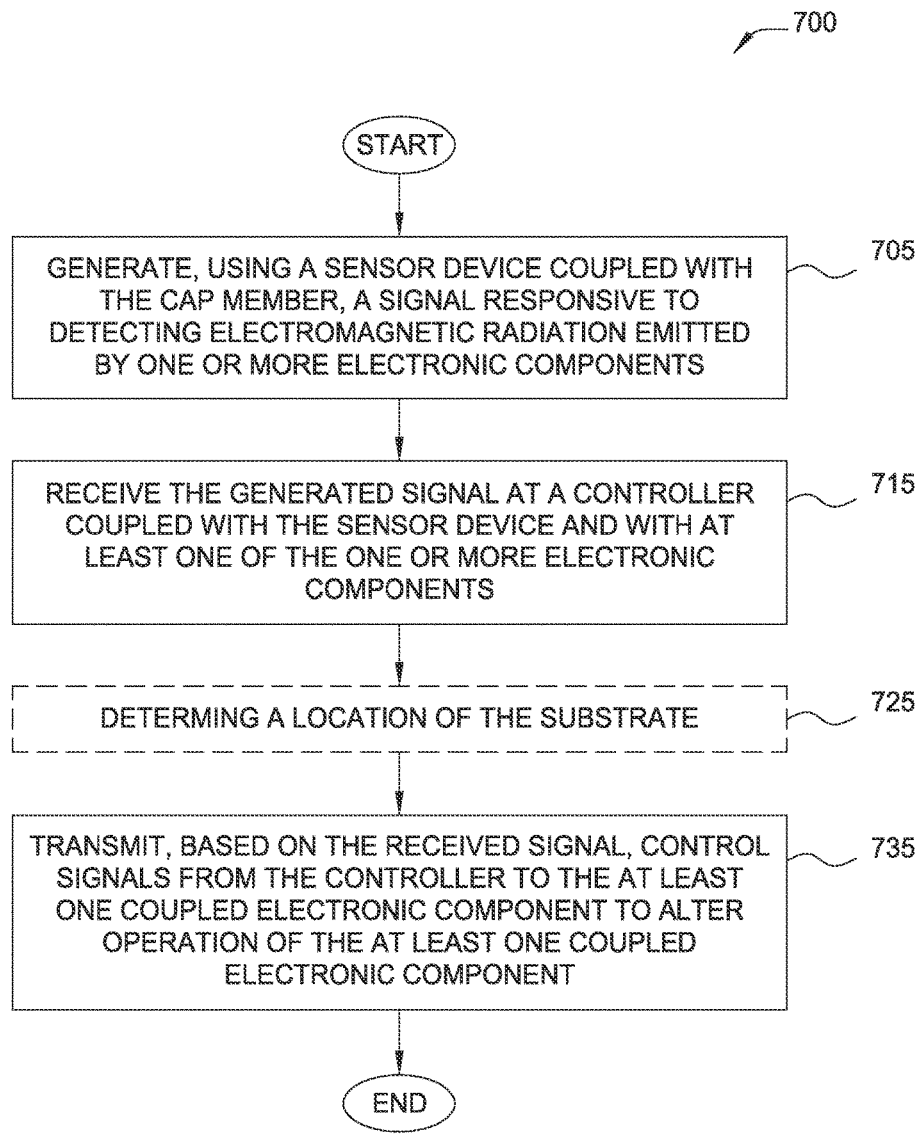
FIG. 7 is a block diagram illustrating a method of controlling electromagnetic radiation emitted by one or more electronic components disposed on a first substrate and at least partially included within an interior cavity formed by an interior surface of a cap member, according to one embodiment.

FIG. 7 is a block diagram illustrating a method of controlling electromagnetic radiation emitted by one or more electronic components disposed on a first substrate and at least partially included within an interior cavity formed by an interior surface of a cap member, according to one embodiment. Method 700 may be performed using a measuring apparatus that includes the cap member, which is more fully described above.

Method 700 begins at block 705, where a sensor signal is generated using a sensor device coupled with the cap member, and responsive to detecting EM radiation emitted by the one or more electronic components. In some embodiments, the sensor device is disposed in or on the cap member of the measuring apparatus. In some embodiments, the one or more electronic components are at least partially included in the interior cavity formed within the cap member.

At block 715, the generated sensor signal is received by a controller coupled with the sensor device. The controller is also coupled with at least one of the one or more electronic components.

At the optional block 725, the location of the substrate is determined by the controller. The location information may be acquired using a navigation circuit and/or a user interface associated with the controller.

At block 735, the controller transmits control signals based on the received sensor signal to the at least one coupled electronic component in order to alter the operation of the at least one coupled electronic component. In some embodiments, the control signals are further based on the determined location (block 725). Altering the operation of the at least one coupled electronic component may be performed during a testing phase and/or during operation of a completed product. Method 700 ends following completion of block 735.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present disclosure, other and further embodiments of the invention may be devised without departing from the basic scope thereof, and the scope thereof is determined by the claims that follow.

What is claimed is:

1. An apparatus for measuring electromagnetic radiation emitted by one or more electronic components included on a first substrate, the apparatus comprising:
   a cap member having an interior surface and an exterior surface, the interior surface defining an interior cavity and arranged to receive at least a portion of the one or more electronic components within the interior cavity;
   at least one sensor device coupled with the cap member and configured to detect electromagnetic radiation emitted by the one or more electronic components; and
   at least one conductive pad disposed on the cap member and coupled with the at least one sensor device,
   wherein the conductive pad is configured to couple with external circuitry to transmit a sensor signal generated by the at least one sensor device responsive to the detected electromagnetic radiation.

2. The apparatus of claim 1, wherein different first and second conductive pads are disposed on the cap member, wherein control signals are provided to the sensor device via the first conductive pad, and wherein the sensor signal is transmitted via the second conductive pad.

3. The apparatus of claim 1, comprising a plurality of sensor devices and a plurality of conductive pads, each of the plurality of sensor devices coupled with a respective one or more of the plurality of conductive pads.

4. The apparatus of claim 1, wherein the external circuitry is disposed on the first substrate.

5. The apparatus of claim 4, wherein the external circuitry includes an adjustable impedance circuit.

6. The apparatus of claim 1, wherein the at least one sensor device comprises an antenna device.

7. The apparatus of claim 6, wherein the antenna device comprises conductive material deposited onto the interior surface of the cap member, wherein the apparatus further comprises at least one conductive pad disposed on the cap member and at least one conductive trace coupling the antenna device with the at least one conductive pad.

8. The apparatus of claim 6, wherein the at least one sensor device comprises first and second antenna devices, the first antenna device arranged to detect electromagnetic radiation at a different range of frequencies than the second antenna device.

9. A system, comprising:
a first substrate comprising one or more electronic components;
at least one measuring apparatus, each measuring apparatus comprising:
a cap member having an interior surface and an exterior surface, the interior surface defining an interior cavity and arranged to receive at least a portion of the one or more electronic components within the interior cavity,
at least one sensor device coupled with the cap member and configured to generate a sensor signal responsive to detecting electromagnetic radiation emitted by the one or more electronic components, and
at least one conductive pad disposed on the cap member and coupled with the at least one sensor device; and
a controller coupled with the at least one measuring apparatus through the at least one conductive pad and with the one or more electronic components, the controller configured to transmit control signals to alter operation of the one or more electronic components based on the sensor signal received from the at least one sensor device.

10. The system of claim 9, wherein the first substrate further comprises a navigation circuit configured to provide location information to the controller, wherein the controller is configured to transmit control signals that are further based on the location information.

11. The system of claim 9, wherein the controller is included on the first substrate.

12. The system of claim 9, further comprising a testing device comprising a second substrate, wherein the controller is included on the second substrate.

13. The system of claim 9, wherein the at least one sensor device comprises an antenna device.

14. The system of claim 13, wherein the at least one measuring apparatus comprises at least one conductive pad disposed on the cap member and at least one conductive trace coupling the antenna device with the at least one conductive pad.

15. The system of claim 14, wherein the at least one conductive pad is arranged to couple with a corresponding conductive pad of the first substrate when the measuring apparatus is seated against the first substrate.

16. A method of controlling electromagnetic radiation emitted by one or more electronic components disposed on a first substrate and at least partially included within an interior cavity formed by an interior surface of a cap member, the method comprising:
generating, using a sensor device coupled with the cap member, a sensor signal responsive to detecting electromagnetic radiation emitted by the one or more electronic components;
receiving, via a conductive pad disposed on the cap member and coupled with the sensor device, the generated sensor signal at a controller coupled with the conductive pad and coupled with at least one of the one or more electronic components;
transmitting, based on the received signal, control signals from the controller to the at least one electronic component to alter operation of the at least one electronic component, thereby altering an amount of electromagnetic radiation emitted by the at least one electronic component.

17. The method of claim 16, further comprising:
determining a location of the first substrate, wherein the transmitter control signals from the controller are further based on the determined location.

18. The method of claim 17, wherein determining the location of the first substrate comprises receiving location input at a user interface associated with the controller.

19. The method of claim 17, wherein determining the location of the first substrate is provided by a navigation circuit coupled with the controller.

20. The method of claim 16, wherein altering operation of the at least one electronic component comprises one of entering a different mode of operation and disabling the at least one electronic component.

* * * * *